(12) United States Patent
Abys et al.

(10) Patent No.: US 6,452,258 B1
(45) Date of Patent: Sep. 17, 2002

(54) ULTRA-THIN COMPOSITE SURFACE FINISH FOR ELECTRONIC PACKAGING

(75) Inventors: Joseph Anthony Abys, Warren; Alan Blair, Murray Hill; Chonglun Fan, Bridgewater; Chen Xu, New Providence, all of NJ (US); Jimmy Chun Wah Kwok, Kowloon (HK)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/707,042

(22) Filed: Nov. 6, 2000

(51) Int. Cl.[7] .............................................. H01L 23/495
(52) U.S. Cl. .................... 257/677; 257/666; 257/673
(58) Field of Search ................... 257/677, 666, 257/678, 673, 691

(56) References Cited

U.S. PATENT DOCUMENTS

| | | | |
|---|---|---|---|
| 5,360,991 A | 11/1994 | Abys et al. | |
| 5,650,661 A | * 7/1997 | Mathew | 257/677 |
| 5,675,177 A | 10/1997 | Abys et al. | |
| 5,914,532 A | * 6/1999 | Akagi et al. | 257/677 |
| 6,323,544 B1 | * 11/2001 | Cigada et al. | 257/677 |

* cited by examiner

*Primary Examiner*—Michael S. Lebentritt
*Assistant Examiner*—Bradley Smith
(74) *Attorney, Agent, or Firm*—Lowenstein Sandler, PC

(57) ABSTRACT

In accordance with the invention, a packaged electronic device comprises at least one electronic device and leads sealed within a protective package. The leads comprise a conductive metal substrate having a composite metal finish with a total thickness of 1000 Å or less. The finish comprises, in succession from the substrate, 25–750 Å of palladium alloy and 5–250 Å of wirebondable and solderable material. The substrate is advantageously nickel-plated copper alloy or Fe—Ni alloy. The content of palladium in the palladium alloy coating can range from 10–95 weight percent. This finish meets requirements of wirebonding and solderability at a thickness surprisingly lower than previously used packaging finishes.

17 Claims, 2 Drawing Sheets

ULTRA-THIN COMPOSITE SURFACE FINISH FOR ELECTRONIC PACKAGING

FIELD OF INVENTION

This invention relates to wire bondable and solderable ultra-thin metal surface finishes for packaging electronic devices such as integrated circuits.

BACKGROUND OF THE INVENTION

Integrated circuit (IC) devices find wide use in products including consumer electronics, household appliances, computers, automobiles, telecommunications, robotics and military equipment. These devices typically comprise an integrated circuit unit (IC unit), a lead frame and a protective enclosure. The IC unit encompasses one or more integrated circuit chips on a plastic or ceramic support base.

The lead frame electrically interconnects the IC unit to circuitry external of the IC device. The lead frame includes a plurality of conductive leads (or lead fingers) defining a central area in which the IC unit is mounted. It also typically includes a mounting paddle and a plurality of separate lead members extending away from a location adjacent to the paddle. In those instances where the paddle is absent, the leads are formed so that the ends of the leads are overlapping the periphery of the IC unit or the ends of the leads are positioned in an abutting or spaced position with the IC unit.

There are several attachment techniques by which the leadframe connects the IC devices in a package. These include die-attachment with solder or conductive adhesive, wire bonding and encapsulation. In all instances attachment requires a particular quality of the leadframe surface. The surface must be oxide free and ready for interaction with other components such as solder, conductive adhesive and gold or aluminum wire. The surface finish of the leadframe plays an important role in providing reliable, reproducible attachment. The external leads should be solderable for connection to external devices such as printed circuit boards.

Lead frames are typically copper alloy electroplated with a layer of nickel. The nickel plating serves as a barrier to diffusion of copper and to the formation of reactive copper products, such as copper oxide and sulfides. Unfortunately, nickel layers in thickness of less than 400 microinches (10.2 micrometers) contains pores through which migration and diffusion of copper to the surface of the lead frame takes place. However, nickel layers having thickness of greater than 400 microinches tend to crack when the leads are eventually bent.

The presence of nickel and nickel products, such as nickel oxide, at the surface of the leads is of concern from the wirebonding and solderability standpoint. Nickel products, such as nickel oxides, interfere with wirebonding and soldering and they are difficult to remove with conventional acidic cleaning.

An attempt to eliminate or at least reduce effects of diffusion of copper through a less than 400 microinches thick nickel layer was made by depositing a thin layer of palladium or palladium/nickel alloy on top of the nickel layer. (See European Patent Application No. 0 250 146 published Dec. 23, 1987). However, copper corrosion products, including oxides, sulfides and other reaction products of copper, continued to appear on the lead frame, discoloring the surface of the lead frame and degrading its wirebonding and soldering ability. A further attempt to overcome these shortcomings was made by plating the copper base with a plurality of layers including, in an ascending order from the copper base, a 5 microinch (127 nanometers) thick nickel strike layer, a 3 microinch (76 nanometers) thick palladium/nickel alloy layer, a nickel layer and a palladium layer. The nickel strike layer and the palladium/nickel alloy layer were intended to act as a barrier to copper ion migration to the surface of the lead frame so as to permit the use of a thinner (less than 400 microinches) nickel layer. (See European Patent Application No. 0 335 608 published Oct. 4, 1989). However, this combination of layers also did not lead to a product which could withstand the effects of processing steps required in the fabrication of the encapsulated devices.

U.S. Pat. No. 5,360,991 issued on Nov. 1, 1994 to J. A. Abys et al., describes a lead frame comprising a base metal, a layer of nickel on the base metal, and a protective composite of metal layers on the nickel. The composite includes, in succession from the nickel layer, a layer of palladium strike or soft gold strike, a layer of palladium-nickel alloy, a layer of palladium and a layer of gold. The various layers are in thickness sufficient to effectively prevent migration of copper and nickel and their respective corrosion products to the surface of the lead frame, depending on the processing and use conditions especially after being subjected to processing thermal conditions exceeding 250° C. Typically the composite is deposited in a total thickness ranging from 10 to 300 microinches (2540–76,200 Å) with gold layer being 1 to 100 microinches thick (254–25,400 Å).

U.S. Pat. No. 5,675,177 issued on Oct. 7, 1997 to J. A. Abys et al., describes a metal lead frame comprising a nickel-plated base metal, and a composite of metal layers comprising, in succession from the nickel, 0.5 to 3.5 microinches (127–889 Å) of palladium or gold strike, 0.5 to 5 microinches (127–1270 Å) of palladium-nickel alloy, 0.5 to 5 microinches (127–1270 Å) of palladium and 0 to 1 microinches of (0–254 Å) gold.

While the finish of the aforementioned patents provide good wirebonding performance and solderability, it would be advantageous to reduce the cost of finishing by finding an even thinner finish which can still meet the wirebonding and solderability requirements.

SUMMARY OF THE INVENTION

In accordance with the invention, a packaged electronic device comprises at least one electronic device and leads sealed within a protective package. The leads comprise a conductive metal substrate having a composite metal finish with a total thickness of 1000 Å or less. The finish comprises, in succession from the substrate, 25– 750 Å of palladium alloy and 5–250 Å of wirebondable and solderable material such as gold or silver or palladium. The substrate is advantageously nickel-plated copper alloy or Fe—Ni alloy. The content of palladium in the palladium alloy coating can range from 10–95 weight percent. This finish meets requirements of wirebonding and solderability at a thickness surprisingly lower than previously used packaging finishes.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
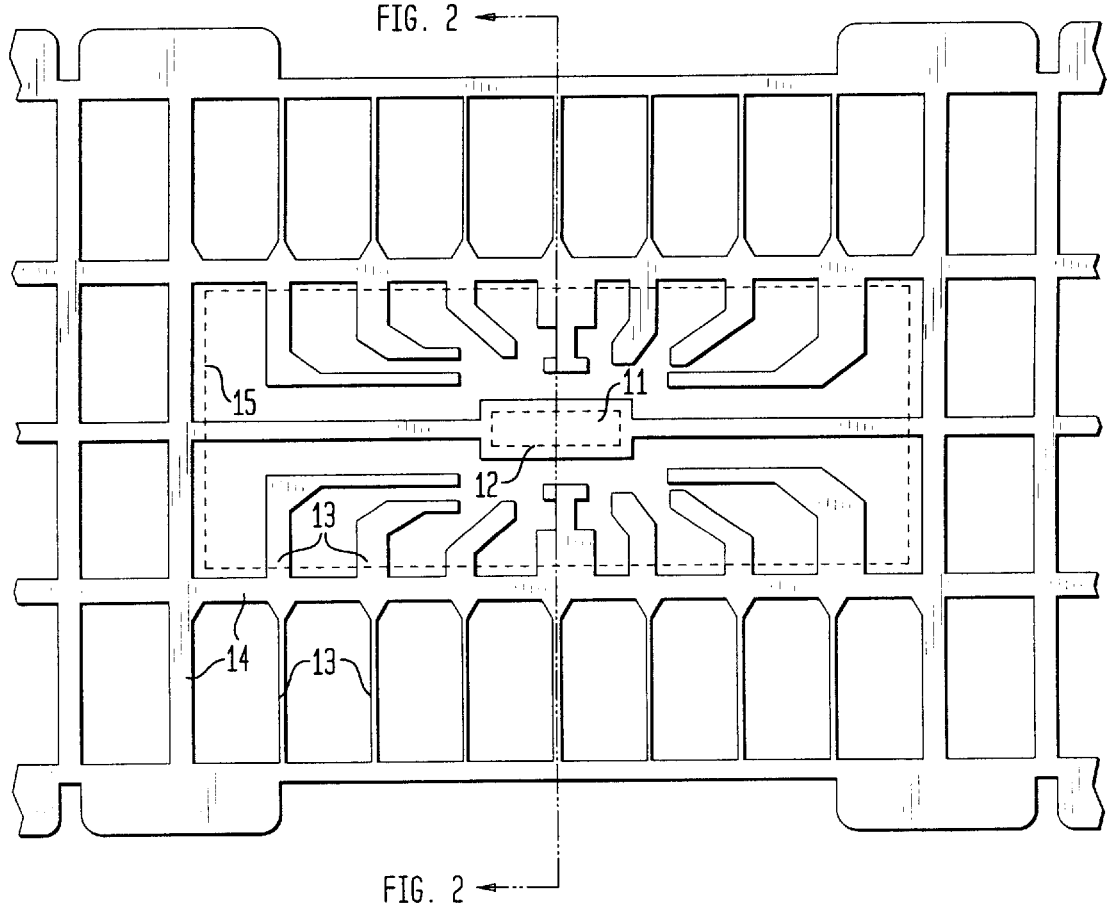
FIG. 1 is a schematic representation of a top view of a typical prior art lead frame with an IC unit mounted thereon.

FIG. 1 illustrates a top view of a typical lead frame, 10, for use with an integrated circuit (IC) unit, 11 (shown in phantom). The lead frame includes a paddle, 12, on which the IC unit is bonded, and leads, 13. Dam bars, 14, which interconnect leads 13 at this stage, are trimmed away after a packaging medium has been applied over an area shown in phantom lines, 15.

For illustration purposes, this invention will be described with reference to an IC packaging in which the packaging medium is a molded plastic material, such as epoxy. However, this invention is applicable to such other embodiments in which the IC unit and the leads are enclosed in a package such as a ceramic package. This invention is also applicable to printed circuit boards provided with metallic pattern on an insulating base.

Figure 2:
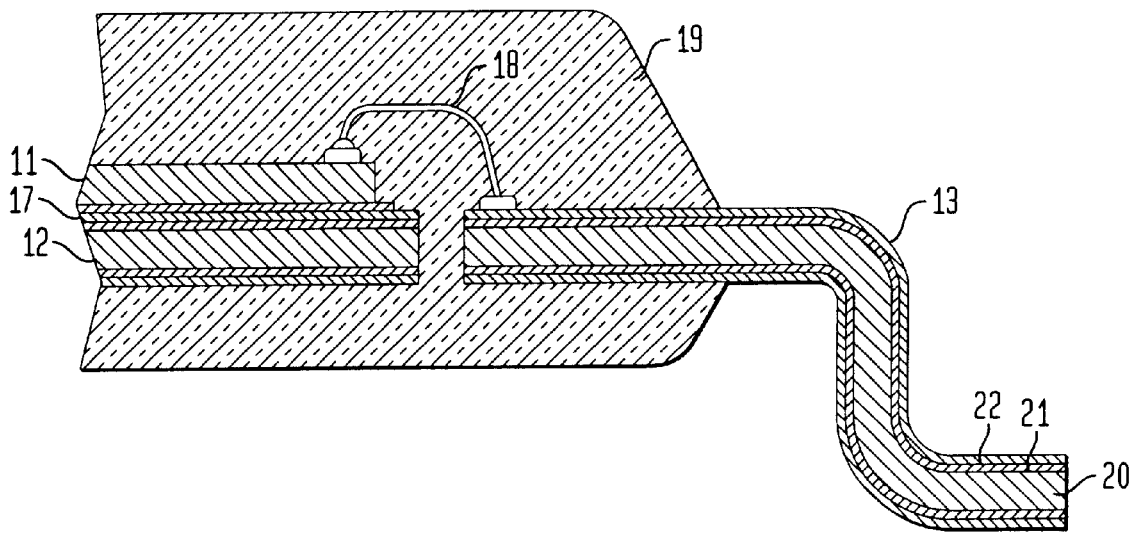
FIG. 2 is a schematic cross-sectional side view of a portion of an encapsulated device taken along the 2—2 line of FIG. 1.

In FIG. 2 is shown a schematic cross-sectional side view of a package 16. The package includes IC unit 11, paddle 12, and leads 13. The IC unit which is bonded on a paddle by solder or adhesive, 17, is electrically connected via wires or tabs 18, to the leads. IC unit 11, paddle 12, wires 18, and portions of the leads adjacent to the paddle are enclosed in a molded packaging medium, 19. The leads include a base metal 20 and an underlayer 21 comprising nickel, on the base metal. The combination of the base metal 20 and the underlayer 21 will be referred to as the metal substrate. A protective composite 22 is disposed on. the metal substrate. Underlayer 21 could alternatively comprise cobalt.

The base metal, 20, is typically a copper or a copper alloy. Copper alloys, such as CDA No. 102 (99.95% Cu, remainder including Ag), CDA No. 103 (99.95 Cu, plus 0.001–0.005 P, and Au), No. 151 (99.9 Cu, 0.1 Zn), No. 155 (97.8 Cu, 0.034 Ag, 0.058 P, 0.11 Mg), No. 194 (97.5 Cu, 2.35 Fe, 0.003P, 0.12 Zn) and KLF 125 (94.55 Cu, 3.2 Ni, 1.25 Sn, 0.7 Si), are representative of the materials being used for the lead frames. Other alloys, such as iron-nickel alloys (Alloy 42) may also be used as the base metal. In this case the underlayer can comprise copper.

The problem of diffusion of copper, nickel and their products to the surface of the leads of the lead frame is solved by depositing on top of nickel layer 21 protective composite finish 22 having a multilayer structure which reduces migration of copper, nickel and their products onto the outer surface of the leads.

Figure 3:
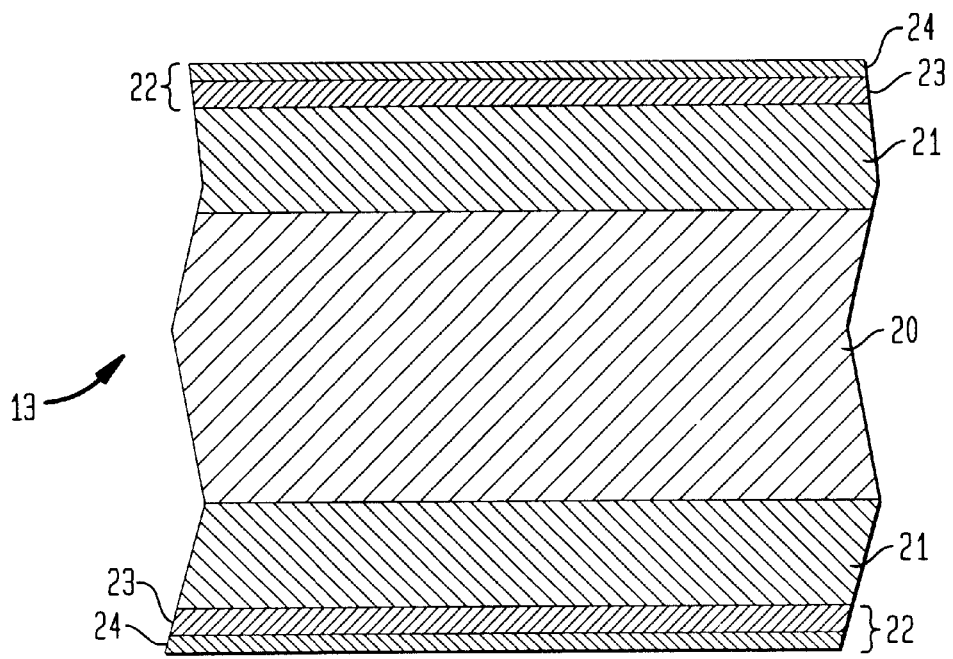
FIG. 3 is an enlarged schematic representation of a cross-section of a small longitudinal portion of the lead having an exemplary finish according to the invention.

FIG. 3 is an enlarged schematic representation of a cross-section of a portion of a lead frame 13 having an exemplary composite finish 22 in accordance with the invention. The composite finish 22 can have a total thicknesss in the range 30–1000 Å and preferably a total thickness of less than 330 Å. It includes, in an ascending order from the metal substrate, a palladium alloy layer 23 and a wirebondable and solderable layer 24. The palladium alloy layer has a thickness in the range 25–750 Å and preferably less than 300 Å. The content of the palladium in the palladium alloy coating can range from 10 to 95 weight percent and preferably is in the range 60–95 weight percent.

The gold has a thickness in the range 5–250 Å. It is preferably less than 30 Å. It is noteworthy that the preferred composite finish contains but one palladium-containing layer.

The palladium alloy layer is preferably palladium cobalt or palladium nickel. A suitable palladium cobalt layer can be deposited as described in U.S. Pat. No. 5,976,344 issued to Abys et al., on Nov. 2, 1999 and entitled "Composition For Electroplating Palladium Alloys and Electroplating Process Using That Composition." A suitable palladium nickel layer can be deposited as described in U.S. Pat. Nos. 4,911,798 and 4,911,799, both of which issued to Abys et al. on Mar. 27, 1990.

The wirebondable and solderable layer may be deposited from any conventional solutions for electroplating that material. Preferably it is gold deposited from high efficiency plating solutions such as are described by F. H. Reed et al., *Gold Plating Technology,* Electrochemical Publications Ltd., Port Erin, Isle of Man, British Isles, 1987, pp. 26 and 46.

Advantageously, the various layers are deposited by the well known reel-to-reel deposition process. They can be deposited to cover the lead frame.

After completing the metal deposition, the lead frames undergo the IC unit mounting process. IC units 11 are mounted on paddle portions 12 of lead frames 10 in a known manner, e.g., by solder or by an adhesive. The electrical connection is made between the IC units 11 and leads 13 by means of wires or tabs 18. It is important that the surface of the leads be bondable to the wires. A solderable surface, which is free of undesirable corrosion products of copper and/or nickel, will also be suitable for bonding of wires thereto. A surface with undesirable corrosion products of copper or nickel may not be wire bondable or may be poorly bondable so that a viable connection may not be established or if established it could become disconnected in operation.

After the IC and wire bonding processing steps, each assembly is placed in a molding apparatus, and plastic encapsulating material is injected around each IC unit and adjacent parts of the leads and forms an external IC unit package. After removing the assembly from the molding apparatus, the molded IC packages are separated from the lead frames by separating the ends of the leads from the lead frame and by removing dam portions between the leads. The leads are then bent into a desirable configuration, e.g., gull wing, "J" or butt form. Portions of the leads exposed from the molding compound are cleaned by organic solvents and plasma and soldered to pads on a mounting board. In one instance the cleaned leads are placed in contact with solder bumps or solder paste on the mounting board and are soldered to pads on the mounting board by refluxing. In another instance, the cleaned leads are immersed into a molten bath of solder and then are placed in contact with fluxed terminal pads on the mounting board.

It is imperative for reliable connection between the IC unit and the mounting board that the leads should have a solderable surface. This means that the surface of these portions of the leads which are to be secured to pads on the board should be capable to receive a substantially continuous coating of solder. A surface with a solder coating covering 95% or more of the area to be soldered is acceptable as being solderable.

To determine whether or not the surface of the lead frame would be suitable for a reliable connection, the lead frames with or without the encapsulating material are subjected to reliability tests including wirebonding and solderability tests. Wirebonding tests are performed to verify the reproducibility and the reliability of this type of bond. AT&T standard A-87AL1917, for example, identifies mode of failure and acceptance criteria. Industrial users typically test the wirebonding including pretreatments such as thermal aging or plasma cleaning steps. One of the solderability tests is a Military Specification 883D, Method 2003.7 which is used as a qualifying criterion for acceptability. This standard involves steam aging for 8 hours. This is presumed to simulate a shelf life of at least 6 months. Thereafter, the samples are subjected to an application of mildly activated flux to exposed metal leads and immersion in solder at 245° C. for 5 seconds. Samples are then evaluated for solder coverage at 10× magnification. Coatings to be solderability acceptable must have at least 95% coverage of high-quality smooth solder.

To test the subject finishes, nickel-plated copper alloy leadframes were fabricated with two different thicknesses of PdCo (82/18 weight %). One finish was 295 Å of PdCo with 17.5 Å of Au. The other was 345 Å of PdCo with 17.5 Å Au. The resulting structures were each tested for 15 wire bonds with the results set forth in Tables 1 and 2, respectively.

Wirebonding/pull Test Results
295 Å PdCo and 17.5 Å Au after thermal aging at 175° C. for 2 hrs.

TABLE 1

| Test | Mean pull force (g) | STD dev (g) | Min. (g) | Max. (g) | Pass |
| --- | --- | --- | --- | --- | --- |
| 15 | 8.30 | 0.75 | 6.47 | 9.07 | 15 (100%) |

345 Å PdCo and 17.5 Å Au after thermal aging at 175° C. for 2 hrs.

TABLE 2

| Test | Mean pull force (g) | STD dev (g) | Min (g) | Max. (g) | Pass |
| --- | --- | --- | --- | --- | --- |
| 15 | 7.27 | 0.91 | 6.04 | 8.44 | 15 (100%) |

*Our Requirement: minimum pull force ≧5.00 grams

Samples with the same finish were tested for solderability with the results set forth in Table 3:

Solderability test results

TABLE 3

| Sample | Pre-Treat | Solder Coverage |
| --- | --- | --- |
| 295Å PdCo and 17.5Å Au | As plated | Pass |
| 295Å PdCo and 17.5Å Au | 2 hrs. thermal aging (175° C.) + 8 hrs. steam aging (85° C./85% relative humidity) | Pass |
| 345Å PdCo and 17.5Å Au | As plated | Pass |
| 345Å PdCo and 17.5Å Au | 2 hrs. thermal aging (175° C.) + 8 hrs. steam aging (85° C./85% relative humidity) | Pass |

*Our Requirement: solder coverage >95%

These tests show that the surface finish, despite its much lower thickness than conventional lead frame finishes, is useful for electronic packaging applications and provides considerable savings in. the quantity of noble metal.

It is to be understood that the above-described embodiments are illustrative of only a few of the many possible specific embodiments of the invention. Numerous and varied other arrangements can be made by those skilled in the art without departing from the spirit and scope of the invention.

What is claimed:

1. A packaged electronic device comprising at least one electronic device, a plurality of electrical leads electrically connected to the device and a protective package sealing the electronic device, the leads comprising a conductive metal substrate having a composite metal finish with a total thickness of 1000 Å or less, the finish consisting, in succession from the substrate, a layer of palladium alloy and a layer of wirebondable and solderable material wherein the layer of palladium alloy has a thickness of at least 25 Å, the layer of wirebondable and solderable material has a thickness of 5–250 Å and the finish has a total thickness of less than 330 Å.

2. A packaged electronic device comprising at least one electronic device, a plurality of electrical leads electrically connected to the device and a protective package sealing the electronic device, the leads comprising a conductive metal substrate having a composite metal finish with a total thickness of 1000 Å or less, the finish consisting, in succession from the substrate, a layer of palladium alloy and a layer of wirebondable and solderable material wherein the layer of palladium alloy has a thickness of at least 25 Å but less than 300 Å and the layer of wirebondable and solderable material has a thickness of 5–250 Å.

3. A packaged electronic device comprising at least one electronic device, a plurality of electrical leads electrically connected to the device and a protective package sealing the electronic device, the leads comprising a conductive metal substrate having a composite metal finish with a total thickness of 1000 Å or less, the finish consisting, in succession from the substrate, a layer of palladium alloy and a layer of wirebondable and solderable material wherein the layer of palladium alloy has a thickness in the range 25–750 Å and the layer of wirebondable and solderable material has a thickness of less than 30 Å.

4. A packaged electronic device comprising at least one electronic device, a plurality of electrical leads electrically connected to the device and a protective package sealing the electronic device, the leads comprising a conductive metal substrate having a composite metal finish with a total thickness of 1000 Å or less, the finish consisting, in succession from the substrate, a layer of palladium alloy and a layer of wirebondable and solderable material wherein the palladium alloy has a palladium content in the range 10–95 weight percent.

5. A packaged electronic device comprising at least one electronic device, a plurality of electrical leads electrically connected to the device and a protective package sealing the electronic device, the leads comprising a conductive metal substrate having a composite metal finish with a total thickness of 1000 Å or less, the finish consisting, in succession from the substrate, a layer of palladium alloy and a layer of wirebondable and solderable material wherein the palladium alloy has a palladium content in the range 60–95 weight percent.

6. The packaged electronic device of claim 1 wherein the palladium alloy comprises a palladium cobalt.

7. The packaged electronic device of claim 1 wherein the palladium alloy comprises a palladium nickel.

8. The packaged electronic device of claim 1 wherein the wirebondable and solderable material comprises gold, silver or palladium.

9. The packaged electronic device of claim 1 wherein the metal substrate comprises copper alloy.

10. The packaged electronic device of claim 1 wherein the metal substrate comprises an iron alloy.

11. A packaged electronic device comprising at least one electronic device, a lead frame comprising plurality of electrical leads electrically connected to the device and a protective package sealing the electronic device, the leads comprising a conductive metal substrate having a composite metal finish, the finish comprising, in succession from the substrate, a single palladium-containing layer of palladium alloy and a layer of wirebondable and solderable material wherein the palladium-containing layer has a thickness of at least 25 Å, the layer of wirebondable and solderable material has a thickness of 5–250 Å and the finish has a total thickness of less than 330 Å.

12. The packaged electronic device of claim 11 wherein the palladium alloy comprises palladium cobalt.

13. The packaged electronic device of claim 12 wherein the wirebondable and solderable material comprises gold.

14. The packaged electronic device of claim 11 wherein the lead frame comprises a conductive metal substrate covered by a composite metal finish with a total thickness of 1000 Å or less, the finish comprising in succession from the substrate, a single palladium-containing layer of palladium alloy having a thickness in the range 25–750 Å and a layer of wirebondable and solderable material having a thickness of 5–250 Å.

15. The packaged electronic device of claim 14 wherein the finish has a total thickness of less than 330 Å.

16. The packaged electronic device of claim 14, wherein the palladium alloy comprises palladium cobalt.

17. The packaged electronic device of claim 14, wherein the wirebondable and solderable material comprises gold.

* * * * *